United States Patent
Huang

(10) Patent No.: US 10,724,139 B2
(45) Date of Patent: Jul. 28, 2020

(54) ENCAPSULATION METHOD FOR OLED PANEL

(71) Applicant: Wuhan China Star Optoelectronics Semiconductor Display Technology Co., Ltd., Wuhan (CN)

(72) Inventor: Jing Huang, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 201 days.

(21) Appl. No.: 15/569,772

(22) PCT Filed: Aug. 18, 2017

(86) PCT No.: PCT/CN2017/098171
§ 371 (c)(1),
(2) Date: Oct. 27, 2017

(87) PCT Pub. No.: WO2018/232949
PCT Pub. Date: Dec. 27, 2018

(65) Prior Publication Data
US 2018/0363135 A1 Dec. 20, 2018

(30) Foreign Application Priority Data
Jun. 19, 2017 (CN) .......................... 2017 1 0465750

(51) Int. Cl.
*C23C 16/455* (2006.01)
*H01L 51/00* (2006.01)
(Continued)

(52) U.S. Cl.
CPC ........ *C23C 16/45525* (2013.01); *C23C 16/04* (2013.01); *C23C 16/40* (2013.01);
(Continued)

(58) Field of Classification Search
CPC . H01L 151/525; H01L 151/56; H01L 51/525; H01L 51/56; H01L 51/0021; H01L 51/5203; H01L 27/3281; H01L 27/3823
See application file for complete search history.

(56) References Cited

U.S. PATENT DOCUMENTS

2003/0203284 A1* 10/2003 Iriguchi .............. G03F 7/70125
430/1
2007/0063636 A1* 3/2007 Guenther ............ H01L 27/3281
313/503
(Continued)

FOREIGN PATENT DOCUMENTS

CN 102709486 A 10/2012
CN 102751445 A 10/2012
(Continued)

OTHER PUBLICATIONS

CN-106848087-B Translation of Chinese Application (Year: 2017).*

*Primary Examiner* — Francisco W Tschen
(74) *Attorney, Agent, or Firm* — Leong C. Lei

(57) ABSTRACT

The invention provides a encapsulation method for OLED panel, by forming an organic defining film surrounding the OLED device on the substrate, then using ALD process to form an inorganic film on the substrate and OLED device covering the package region and then removing the organic defining film to obtain an ALD film corresponding to the above of the package region, and finally forming a package film on ALD film corresponding to the above of the package region complete encapsulation the OLED panel. The present invention uses an organic defining film to realize selective atomic layer deposition, thereby avoiding using the atomic layer deposition mask and related cleaning and replacement problems. The process is relatively simple, thus saving costs, and the resulted package structure meets the encapsulation
(Continued)

providing a substrate, forming an OLED device on the substrate, forming an organic defining film on the substrate surrounding the periphery of the OLED device, the organic defining film enclosing a package region on the substrate — S1 performing atomic layer disposition on the substrate and the OLED device to obtain a layer of inorganic film covering the package region, removing the organic defining film, and obtaining a corresponding atomic layer deposition film located above the package region through the inorganic film — S2 forming a package film on the atomic layer deposition film so as to complete packaging the OLED panel — S3 requirements of flexible OLED panel, able to effectively block the external water oxygen to protect the OLED device.

10 Claims, 3 Drawing Sheets

(51) Int. Cl.
    *H01L 51/52*     (2006.01)
    *C23C 16/04*     (2006.01)
    *C23C 16/40*     (2006.01)
    *H01L 51/56*     (2006.01)

(52) U.S. Cl.
    CPC ........ *H01L 51/0002* (2013.01); *H01L 51/525* (2013.01); *H01L 51/5237* (2013.01); *H01L 51/5256* (2013.01); *H01L 51/56* (2013.01)

(56) References Cited

U.S. PATENT DOCUMENTS

| | | | |
|---|---|---|---|
| 2008/0116800 A1* | 5/2008 | Kang | H01B 3/08 313/582 |
| 2010/0271634 A1* | 10/2010 | Dominguez Horna | G01N 21/45 356/477 |
| 2011/0105637 A1* | 5/2011 | Fujita | C08L 23/22 522/120 |
| 2013/0220159 A1* | 8/2013 | Matsumi | C11D 7/5027 101/492 |

FOREIGN PATENT DOCUMENTS

| | | |
|---|---|---|
| CN | 106158901 A | 11/2016 |
| CN | 106711354 A | 5/2017 |
| CN | 106848087 A | 6/2017 |

\* cited by examiner

ENCAPSULATION METHOD FOR OLED PANEL

BACKGROUND OF THE INVENTION

1. Field of the Invention

The present invention relates to the field of panel display techniques, and in particular to a encapsulation method for OLED.

2. The Related Arts

The organic light-emitting display (OLED) devices have the advantages of active-luminous, low driving voltage, high emission efficiency, fast response, high contrast and clarity, near 180° viewing angle, wide temperature range, ability to realize flexible and large-size full-color display, and so on, are considered the emerging applications technology for the next generation display devices.

Unlike the conventional liquid crystal display (LCD) technology, the OLED display technology does not need backlight and uses ultra-thin organic material coating and glass substrate. The organic material emits light when a current flows through. However, because the organic material is easy to react with water or oxygen, the OLED display, as a display device based on the organic material, poses high requirements on the encapsulation. Thus, the encapsulation of OLED devices to improve the internal seal of the device, for insulation from the external environment as far as possible, is essential for stable emission for OLED devices.

The current OLED device package mainly uses encapsulation glue on a rigid encapsulation substrate (such as, glass or metal), but this approach is not applicable to flexible devices. As the flexible OLED display is the inevitable trend for the future development of the industry, there are technical solutions by stacking thin films to encapsulate the OLED device. The thin film encapsulation usually forms two barrier layers of inorganic materials with good water barrier property over the OLED device on the substrate. A buffer layer of organic material with good flexible and durable property is formed between the two barrier layers. At present, this encapsulation technology is more matured, achieves a good encapsulation effect, and is applied to the relevant products.

In the above thin film encapsulation approach, the inorganic barrier layer is generally formed by plasma enhanced chemical vapor deposition (PECVD), atomic layer deposition (ALD), or physical vapor deposition (PVD) and so on, and the organic buffer layer is mainly prepared by PECVD or inkjet printing (IJP). The ALD equipment is mainly used to deposit alumina ($Al_2O_3$), and the resulted film has good compactness, high coverage and controllable thickness. As with PECVD technology, a metal mask is usually used for patternizing in ALD processes. However, how to clean the mask used by the ALD (to remove the deposited $Al_2O_3$) is a very tough issue, as the alumina film is difficult to be cleaned by plasma. If wet etching is used, the life span of the mask will be affected and the production cost is increased.

Levy et al. reported the use of IJP to patternize the sprayed polymer-polyvinylpyrrolidone (PVP) on a silicon oxide substrate in order to inhibit the growth of the ALD film and selectively grow the $Al_2O_3$ film in the non-sprayed region, and finally using of oxygen ($O_2$) plasma to remove the polymer PVP to achieve selective-ALD (SALD) technical solution. Farm et al. also reported the use of another polymer, polymethylmethacrylate (PMMA), to inhibit the growth of ALD films. This approach of selective-deactivation by using spraying polymers allows the process to be relatively simple and less costly than the conventional method of patternizing ALD films without the use of mask and wet etching processes. However, this method has not been reported to be applied in the field of OLED encapsulation.

SUMMARY OF THE INVENTION

The object of the present invention is to provide a encapsulation method for OLED panel, with an atomic layer deposited film disposed on the substrate at corresponding encapsulation location covering the OLED device, by using an organic defining film to realize selective atomic layer deposition, thereby avoiding using the atomic layer deposition mask and related cleaning and replacement problems.

To achieve the above object, the present invention provides a encapsulation method for OLED panel, comprising the steps of:

Step S1: providing a substrate, forming an OLED device on the substrate, forming an organic defining film on the substrate surrounding the periphery of the OLED device, the organic defining film enclosing a package region on the substrate;

Step S2: performing atomic layer disposition on the substrate and the OLED device to obtain a layer of inorganic film covering the package region, removing the organic defining film, and obtaining a corresponding atomic layer deposition film located above the package region through the inorganic film;

Step S3: forming a package film on the atomic layer deposition film.

According to a preferred embodiment of the present invention, in Step S1, the organic defining film is made of polyvinylpyrrolidone or polymethyl methacrylate, and has a thickness of 0.5 μm or more.

According to a preferred embodiment of the present invention, in Step S1, the organic defining film is formed by an ink-jet printing process.

According to a preferred embodiment of the present invention, in Step S2, the organic defining film is removed by using oxygen plasma, and the oxygen plasma is generated in plasma enhanced chemical vapor deposition equipment.

According to a preferred embodiment of the present invention, in Step S2, the atomic layer deposition film is made of alumina ($Al_2O_3$), silicon oxide ($SiO_x$), or zirconium dioxide ($ZrO_2$), and has a thickness of 25-100 nm.

According to a preferred embodiment of the present invention, the package film formed in Step S3 comprises at least an inorganic barrier layer and at least an organic buffer layer, with a single layer of the inorganic barrier layer and a single layer of the organic buffer layer alternately stacked on the atomic layer deposition film, and the uppermost layer of the package film is an inorganic barrier layer.

According to a preferred embodiment of the present invention, in Step S3, the inorganic barrier layer is deposited by a plasma enhanced chemical vapor deposition, pulsed laser deposition, or sputtering process.

According to a preferred embodiment of the present invention, in Step S3, the inorganic barrier layer is made of silicon nitride, silicon oxide, silicon oxynitride, or silicon carbon nitrogen, and has a thickness 0.5-3 μm; and the organic buffer layer is made of hexamethyl disulfide, polyacrylate, polycarbonate, or polystyrene, or a polystyrene, and has a thickness of 1-10 μm.

According to a preferred embodiment of the present invention, the package film formed in Step S3 comprises two inorganic barrier layers and one organic buffer layer; one of the inorganic barrier layers is disposed on upper surface of the atomic layer deposition film.

According to a preferred embodiment of the present invention, the package film formed in Step S3 comprises one inorganic barrier layer and one organic buffer layer; the organic buffer layer is disposed on upper surface of the atomic layer deposition film.

The present invention also provides a encapsulation method for OLED panel, comprising the steps of:

Step S1: providing a substrate, forming an OLED device on the substrate, forming an organic defining film on the substrate surrounding the periphery of the OLED device, the organic defining film enclosing a package region on the substrate;

Step S2: performing atomic layer disposition on the substrate and the OLED device to obtain a layer of inorganic film covering the package region, removing the organic defining film, and obtaining a corresponding atomic layer deposition film located above the package region through the inorganic film;

Step S3: forming a package film on the atomic layer deposition film;

wherein in Step S1, the organic defining film being made of polyvinylpyrrolidone or polymethyl methacrylate, and having a thickness of 0.5 μm or more.

wherein in Step S1, the organic defining film being formed by an ink-jet printing process.

wherein in Step S2, the organic defining film being removed by using oxygen plasma, and the oxygen plasma being generated in plasma enhanced chemical vapor deposition equipment.

wherein in Step S2, the atomic layer deposition film being made of alumina ($Al_2O_3$), silicon oxide ($SiO_x$), or zirconium dioxide ($ZrO_2$), and having a thickness of 25-100 nm wherein the package film formed in Step S3 comprising at least an inorganic barrier layer and at least an organic buffer layer, with a single layer of the inorganic barrier layer and a single layer of the organic buffer layer being alternately stacked on the atomic layer deposition film, and the uppermost layer of the package film is an inorganic barrier layer.

Compared to the known techniques, the present invention provides the following advantages. The present invention provides a encapsulation method for OLED panel, by forming an organic defining film surrounding the OLED device on the substrate, then using ALD process to form an inorganic film on the substrate and OLED device covering the package region and then removing the organic defining film to obtain an ALD film corresponding to the above of the package region, and finally forming a package film on ALD film corresponding to the above of the package region complete encapsulation the OLED panel. The present invention uses an organic defining film to realize selective atomic layer deposition, thereby avoiding using the atomic layer deposition mask and related cleaning and replacement problems. The process is relatively simple, thus saving costs, and the resulted package structure meets the encapsulation requirements of flexible OLED panel, able to effectively block the external water oxygen to protect the OLED device.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
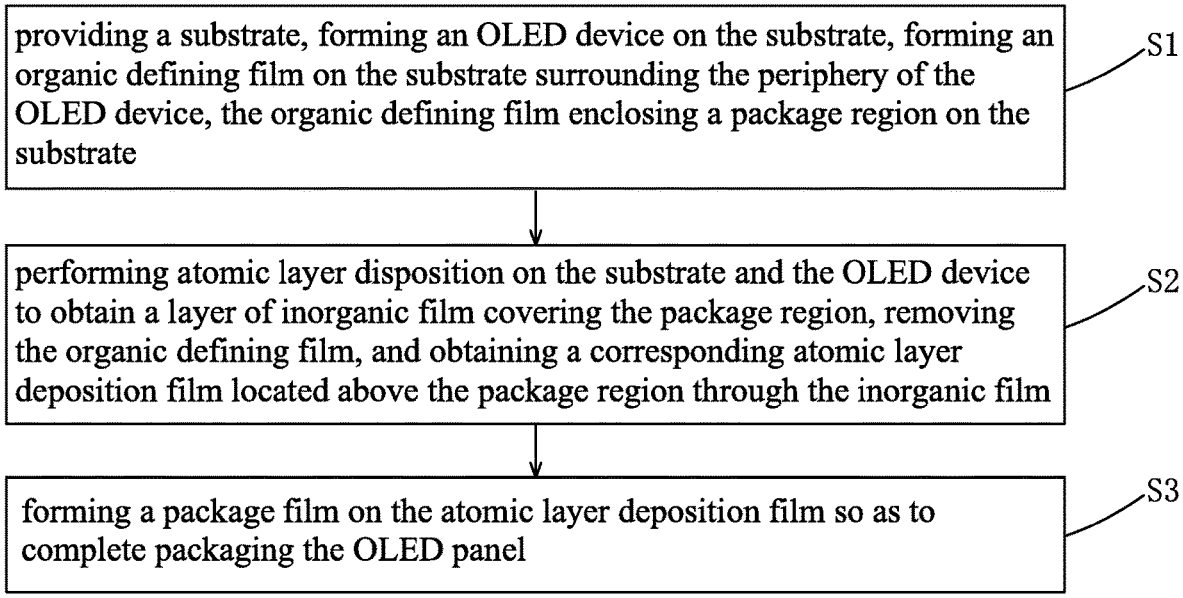
FIG. 1 is a schematic view showing a flowchart of encapsulation method for OLED panel provided by an embodiment of the present invention.
Figure 2:
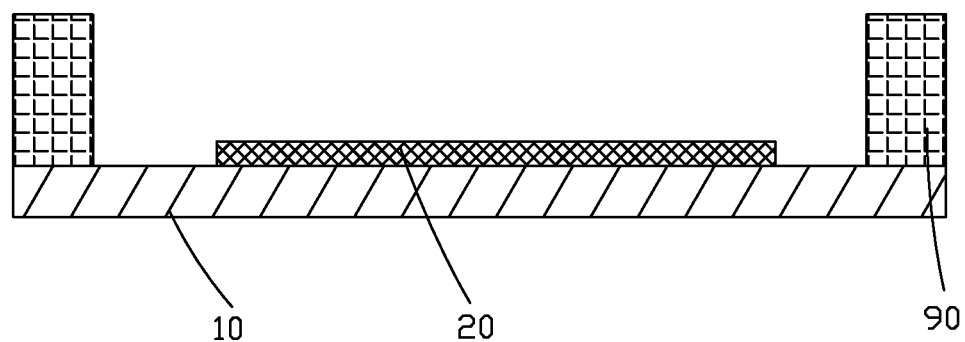
FIG. 2 is a schematic view showing Step 1 of the encapsulation method for OLED panel provided by an embodiment of the present invention.

Referring to FIG. 1, the present invention provides a encapsulation method for OLED panel, comprising the steps of:

Step S1: as shown in FIG. 2, providing a substrate 10, forming an OLED device 20 on the substrate 10, forming an organic defining film 90 on the substrate 10 surrounding the periphery of the OLED device 20 by ink-jet printing, the organic defining film 90 enclosing a package region on the substrate 10.

Specifically, the substrate 10 is a thin film transistor (TFT) substrate, disposed with a TFT layer.

Specifically, in Step S1, a gap must exist between the formed organic defining film 90 and the OLED device 20, that is, there must be a distance between the organic defining film 90 and the active area (AA) of the OLED device.

Figure 3:
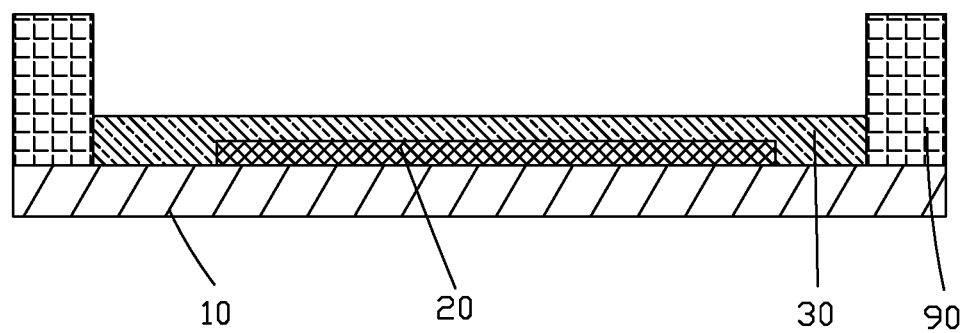
FIGS. 3-4 are schematic views showing Step 2 of the encapsulation method for OLED panel provided by an embodiment of the present invention.
Figure 4:
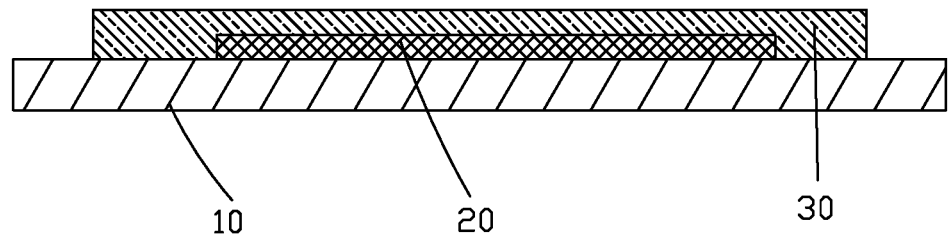

Step S2: as shown in FIG. 3 and FIG. 4, performing atomic layer disposition (ALD) on the substrate 10 and the OLED device 20 to obtain a layer of inorganic film completely covering the package region, during the deposition, the organic defining film 90 being able to suppress inorganic material from depositing on the surface of the organic defining film 90; then removing the organic defining film 90 by oxygen plasma, and obtaining a corresponding atomic layer deposition film 30 located above the package region through the inorganic film.

Specifically, the organic defining film 90 is made of organic polymer material able to suppress the growth of metal oxide, such as, polyvinylpyrrolidone or polymethyl methacrylate, and so on.

Specifically, in Step S2, the organic defining film 90 has a thickness of 0.5 μm or more.

Specifically, in Step S2, the oxygen plasma may be generated in a plasma enhanced chemical vapor deposition equipment, and the organic defining film 90 is removed inside the plasma enhanced chemical vapor deposition equipment, although the process of removing the organic defining film 90 may also be performed in other equipment able to generate oxygen plasma. During the process, the organic defining film 90 can be easily etched away by oxygen plasma while the atomic layer deposition film 30 can be retained well and thus effectively block water vapor away from the OLED device 20.

Specifically, the atomic layer deposition film is made of an inorganic material able to enhance the water oxygen blocking, such as, alumina ($Al_2O_3$), silicon oxide ($SiO_x$), or zirconium dioxide ($ZrO_2$), and has a thickness of 25-100 nm.

Step S3: forming a package film 40 on the atomic layer deposition film 30. The package film 40 comprises at least an inorganic barrier layer 41 and at least an organic buffer layer 42, with a single layer of the inorganic barrier layer 41 and a single layer of the organic buffer layer 42 alternately stacked on the atomic layer deposition film 30, and the uppermost layer of the package film 40 is an inorganic barrier layer.

The present invention uses an organic defining film 90 to realize selective atomic layer deposition, thereby avoiding using the atomic layer deposition mask and related cleaning and replacement problems. The process is relatively simple, thus saving costs, and the resulted package structure meets the encapsulation requirements of flexible OLED panel, able to effectively block the external water oxygen to protect the OLED device 20.

Specifically, in Step S3, the inorganic barrier layer 41 of the package film 40 is deposited by a plasma enhanced chemical vapor deposition (PECVD), pulsed laser deposition (PLD), or sputtering process. Alternatively, the inorganic barrier layer 41 can be deposited by ALD process. Preferably, in Step S3, the inorganic barrier layers 41 are all formed by PECVD although the PECVD uses a mask to form the inorganic barrier layers 41. However, after forming the inorganic barrier layers 41, the residual material deposited on the mask can be removed inside a PECVD equipment. The removal is easy and the process is simple.

Specifically, when an inorganic barrier layer 41 is deposited by ALD, the inorganic barrier layer 41 is prepared by using an organic polymer material capable of suppressing the growth of the metal oxide, as described in the above steps S1 and S2, to avoid using the ALD mask. The specific process is: forming a backup organic defining film (not shown) on the substrate 10 surrounding the periphery of the ALD film 30 by ink-jet printing, the backup organic defining film 90 enclosing a package region on the substrate 10; performing ALD to obtain a layer of inorganic film completely covering the package region, then removing the backup organic defining film by oxygen plasma, and obtaining an inorganic barrier layer 41 located above the package region.

Specifically, like the organic defining film 90, the backup organic defining film is made of organic polymer material able to suppress the growth of metal oxide, such as, polyvinylpyrrolidone or polymethyl methacrylate, and so on, and has a thickness of 0.5 μm or more.

Specifically, in Step S3, the organic buffer layer 42 can be formed by an ink-jet printing, PECVD, or slot coating process.

Specifically, in Step S3, the inorganic barrier layer 41 is made of an inorganic material able capable of blocking water oxygen, such as, silicon nitride ($SiN_x$), silicon oxide ($SiO_x$), silicon oxynitride (SiON), or silicon carbon nitrogen (SiCN).

Specifically, in Step S3, the inorganic barrier layer 41 has a thickness 0.5-3 μm.

Specifically, in Step S3, the organic buffer layer 42 is made of an organic material capable of buffering the stress during bending and folding the device and cable to cover particle pollutant, such as, hexamethyl disulfide (HMDSO), polyacrylate, polycarbonate, or polystyrene, or a polystyrene.

Specifically, in Step S3, the organic buffer layer 42 has a thickness of 1-10 μm.

Figure 5:
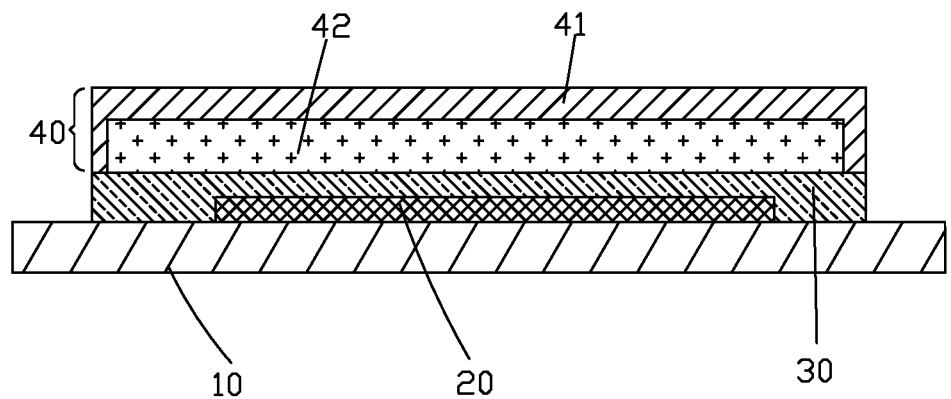
FIG. 5 is a schematic view showing Step 3 of the encapsulation method for OLED panel provided by an embodiment of the present invention.
Figure 6:
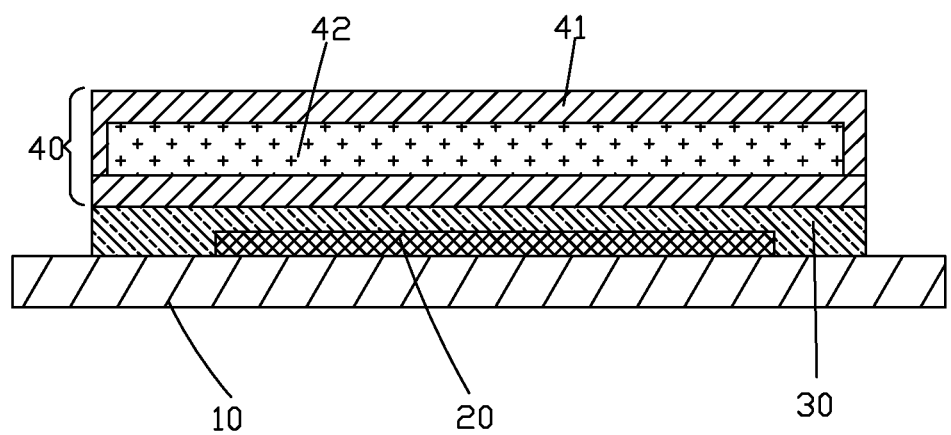
FIG. 6 is a schematic view showing Step 3 of the encapsulation method for OLED panel provided by another embodiment of the present invention.

Specifically, In Step S3, during forming the package film 40, a inorganic barrier layer 41 may be formed on the upper surface of the atomic layer deposition film 30, or an organic buffer layer 42 may be formed on the upper surface of the atomic layer deposition film 30. For example, as shown in FIG. 5, in a referred embodiment of the present invention, the package film 40 formed in Step S3 comprises two inorganic barrier layers 41 and one organic buffer layer 42; one of the inorganic barrier layers 41 is disposed on upper surface of the atomic layer deposition film 30. As shown in FIG. 6, in another preferred embodiment of the present invention, the package film 40 formed in Step S3 comprises one inorganic barrier layer 41 and one organic buffer layer 42; the organic buffer layer 42 is disposed on upper surface of the atomic layer deposition film 30.

In summary, the present invention provides a encapsulation method for OLED panel, by forming an organic defining film surrounding the OLED device on the substrate, then using ALD process to form an inorganic film on the substrate and OLED device covering the package region and then removing the organic defining film to obtain an ALD film corresponding to the above of the package region, and finally forming a package film on ALD film corresponding to the above of the package region complete encapsulation the OLED panel. The present invention uses an organic defining film to realize selective atomic layer deposition, thereby avoiding using the atomic layer deposition mask and related cleaning and replacement problems. The process is relatively simple, thus saving costs, and the resulted package structure meets the encapsulation requirements of flexible OLED panel, able to effectively block the external water oxygen to protect the OLED device.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An encapsulation method for organic light-emitting diode (OLED) panel, comprising the steps of:
    Step S1: providing a substrate, forming an OLED device on the substrate, forming an organic defining film on the substrate surrounding the periphery of the OLED device, the organic defining film enclosing a package region on the substrate;
    Step S2: performing atomic layer disposition on the substrate and the OLED device to obtain a layer of inorganic film covering the package region, removing the organic defining film, and obtaining a corresponding atomic layer deposition film located above the package region through the inorganic film;

Step S3: forming a package film on the atomic layer deposition film;

wherein the organic defining film is completely removed before the package film is formed on the atomic layer deposition film.

2. The encapsulation method for OLED panel as claimed in claim 1, wherein in Step S1, the organic defining film is made of polyvinylpyrrolidone or polymethyl methacrylate, and has a thickness of 0.5 μm or more.

3. The encapsulation method for OLED panel as claimed in claim 1, wherein in Step S1, the organic defining film is formed by an ink-jet printing process.

4. The encapsulation method for OLED panel as claimed in claim 1, wherein in Step S2, the organic defining film is removed by using oxygen plasma, and the oxygen plasma is generated in plasma enhanced chemical vapor deposition equipment.

5. The encapsulation method for OLED panel as claimed in claim 1, wherein in Step S2, the atomic layer deposition film is made of alumina ($Al_2O_3$), silicon oxide ($SiO_X$), or zirconium dioxide ($ZrO_2$), and has a thickness of 25-100 nm.

6. The encapsulation method for OLED panel as claimed in claim 1, wherein the package film formed in Step S3 comprises at least an inorganic barrier layer and at least an organic buffer layer, with a single layer of the inorganic barrier layer and a single layer of the organic buffer layer alternately stacked on the atomic layer deposition film, and the uppermost layer of the package film is an inorganic barrier layer.

7. The encapsulation method for OLED panel as claimed in claim 6, wherein in Step S3, the inorganic barrier layer is deposited by a plasma enhanced chemical vapor deposition, pulsed laser deposition, or sputtering process.

8. The encapsulation method for OLED panel as claimed in claim 6, wherein in Step S3, the inorganic barrier layer is made of silicon nitride, silicon oxide, silicon oxynitride, or silicon carbon nitrogen, and has a thickness 0.5-3 μm; and the organic buffer layer is made of hexamethyl disulfide, polyacrylate, polycarbonate, or polystyrene, and has a thickness of 1-10 μm.

9. The encapsulation method for OLED panel as claimed in claim 6, wherein the package film formed in Step S3 comprises two inorganic barrier layers and one organic buffer layer; one of the inorganic barrier layers is disposed on the upper surface of the atomic layer deposition film.

10. The encapsulation method for OLED panel as claimed in claim 6, wherein the package film formed in Step S3 comprises one inorganic barrier layer and one organic buffer layer; the organic buffer layer is disposed on upper surface of the atomic layer deposition film.

* * * * *